(12) United States Patent
Wojcik

(10) Patent No.: US 6,903,808 B2
(45) Date of Patent: Jun. 7, 2005

(54) ALIGNABLE LOW-PROFILE SUBSTRATE CHUCK FOR LARGE-AREA PROJECTION LITHOGRAPHY

(75) Inventor: Leszek A. Wojcik, Poughquag, NY (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 10/695,692

(22) Filed: Oct. 29, 2003

(65) Prior Publication Data

US 2005/0094123 A1 May 5, 2005

(51) Int. Cl.[7] .................. G03B 27/58; G03B 27/60; G03B 27/62
(52) U.S. Cl. .............. 355/72; 355/73; 355/75; 355/76
(58) Field of Search .................. 355/53, 72, 73, 355/75, 76

(56) References Cited

U.S. PATENT DOCUMENTS

| | | | | |
|---|---|---|---|---|
| 6,324,933 B1 * | 12/2001 | Waskiewicz et al. | .... | 74/490.01 |
| 6,363,809 B1 * | 4/2002 | Novak et al. | ............ | 74/490.09 |
| 6,483,574 B1 * | 11/2002 | Zemel | .......................... | 355/72 |
| 6,756,751 B2 * | 6/2004 | Hunter | ........................ | 318/135 |
| 6,762,826 B2 * | 7/2004 | Tsukamoto et al. | ........... | 355/72 |
| 2001/0019229 A1 * | 9/2001 | Sawai et al. | .................. | 310/12 |
| 2002/0154839 A1 * | 10/2002 | Trost | .......................... | 384/100 |
| 2003/0098962 A1 * | 5/2003 | Kubo | .......................... | 355/72 |

* cited by examiner

*Primary Examiner*—Rodney Fuller
(74) *Attorney, Agent, or Firm*—Carl C. Kling

(57) ABSTRACT

An alignable, low-profile substrate chuck for processing, one by one, a number of substrate panels, which may be larger than the chuck itself. The substrate chuck is adjustable in x, y and theta while on the movable platform of a stage, and comprises a nested set of rotatable or sliding brackets adjustable in x, y and theta a positionable vacuum diffuser plate mounted within a coplanar apron on the top bracket. The vacuum diffuser plate fits within a relief cut about the periphery of the apron, which, together with a pattern of islands with their tops coplanar to a ledge formed by the relief, provide location and both bottom and peripheral support for the high-flatness vacuum diffuser plate. The vacuum airflow passes through the vacuum diffuser plate, through the pattern around supporting islands and out through a central yaw shaft about which the yaw rotation centers.

9 Claims, 6 Drawing Sheets

ALIGNABLE LOW-PROFILE SUBSTRATE CHUCK FOR LARGE-AREA PROJECTION LITHOGRAPHY

(B) CROSS-REFERENCE TO RELATED APPLICATIONS (Not Applicable)

(C) STATEMENT REGARDING FEDERALLY SPONSORED RESEARCH OR DEVELOPMENT (Not Applicable)

(D) REFERENCE TO A MICROFICHE APPENDIX (Not Applicable)

(E) BACKGROUND OF THE INVENTION (1) Field of the Invention

This invention relates to projection lithography systems for imaging a pattern on a large substrate, and more particularly relates to an alignable, low-profile substrate chuck for large-area lithography systems featuring a mask and a substrate that is to be imaged in sections while remaining within the depth-of-focus and alignment limits of the projection optics.

(2) Description of Related

Many techniques have been investigated for patterning high-resolution features on large surfaces, most of which involve precision stage devices for movement and positioning of the substrate. Such precision stage devices are expensive, and, while quite precise and effective, sometimes do not have the capacity to maintain position and alignment in all dimensions across the entire substrate.

The projection optics assembly typically needs to be mounted to a heavy, rigid bridge over the stage, and for various reasons typically has a relatively limited clearance above the moving platform of the stage. Techniques of stage-on-stage have been tried, in which a small x-y-theta or x-y-z stage or even an x-y-z-theta stage is mounted on the scanning stage platform for final adjustment. Such stage-on-stage solutions, while inherently possible, tend to be unwieldy and expensive, and tend to take up too much vertical space to fit under the bridge above the stage platform.

BRIEF SUMMARY OF THE INVENTION

The object of the invention is to make possible a high-resolution projection imaging operation on a large substrate with height additions significantly less than the optical space between projection optics and scanning stage.

Another object of the invention is to permit adjustment of the substrate alignment after each partial exposure.

A feature of the invention is an adjustable substrate chuck having a very flat vacuum gripping surface and very small vertical height.

Another feature of the invention is a three-degree-of-movement vernier platform which is of very limited height and very limited mass.

An advantage of the invention is that it makes it possible to perform high-resolution projection imaging on a large substrate with a limited-travel imaging system.

Another advantage of the invention is that it enables imaging on substrates of a greater range of thicknesses.

Other objects, features and advantages of the invention will be apparent to those skilled in the art, in view of the drawings and written description.

(G) BRIEF DESCRIPTION OF THE SEVERAL VIEWS OF THE DRAWING

(H) DETAILED DESCRIPTION OF THE INVENTION

Figure 1:
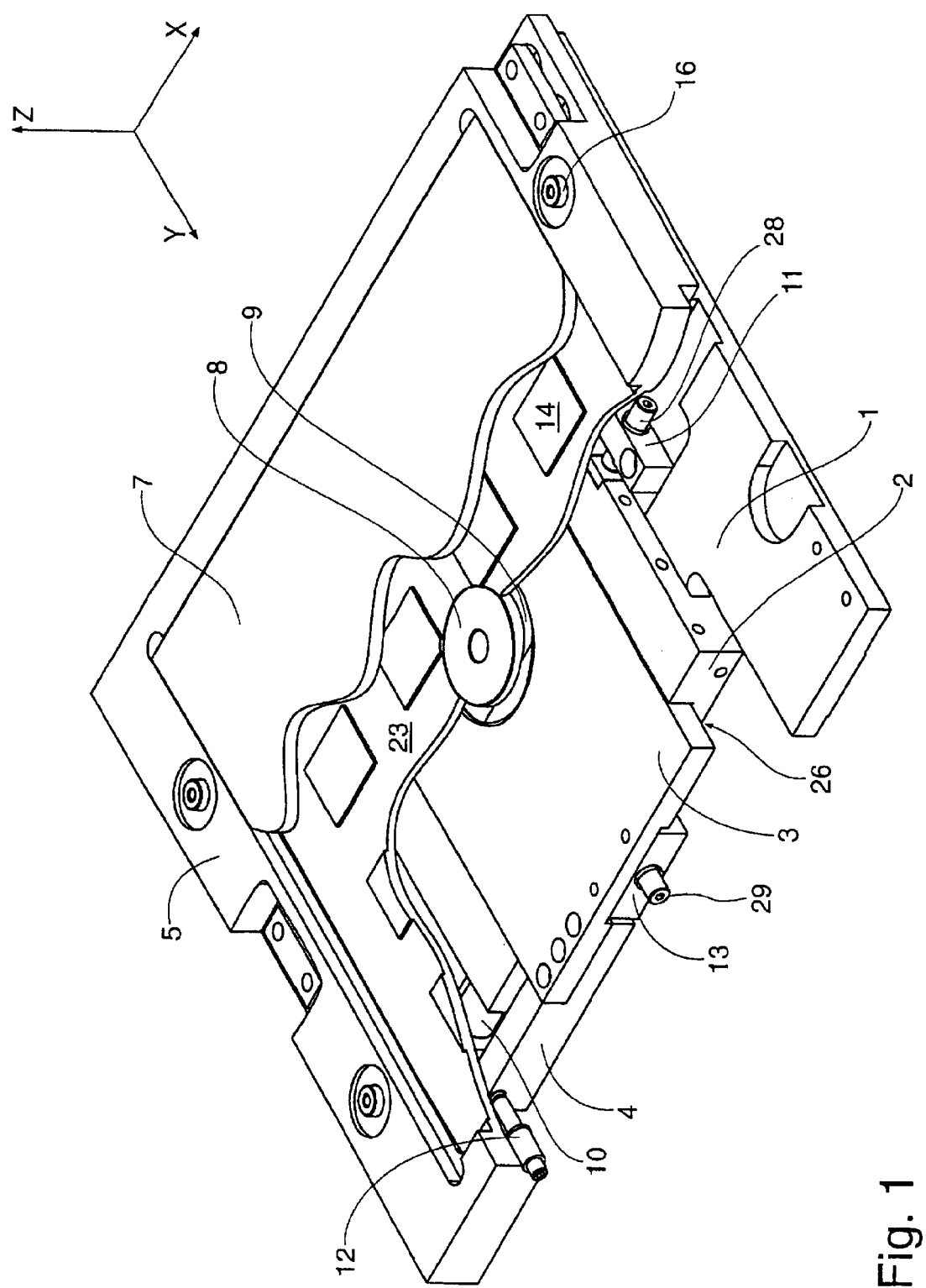
FIG. 1 is a simplified semidiagrammatic elevation view of a preferred embodiment of the invention, partially cut away to show x, y and yaw adjustments.

FIG. 1 shows the preferred embodiment of a low-profile, high-resolution alignable substrate chuck for patterning onto large substrates. The desire is to have the substrate chuck grasp and hold a panel which is a segment of a multi-panel substrate, during imaging, then let go as the stage repositions to a different panel. The requirement is that the substrate chuck not damage the substrate even by temporarily bending the substrate. Vacuum is applied selectively to hold the substrate on the vacuum diffuser plate. The substrate typically will have two or more alignment marks in the panel or related to the panel, and the system will have means to identify the alignment marks and to determine alignment. After being repositioned, the substrate may be slightly misaligned at the best available stage position. Final alignment is accomplished manually, with the stage platform being held motionless, by the operator, by rotating s, y and theta adjustment screws in their respective adjustment assemblies.

Figure 2:
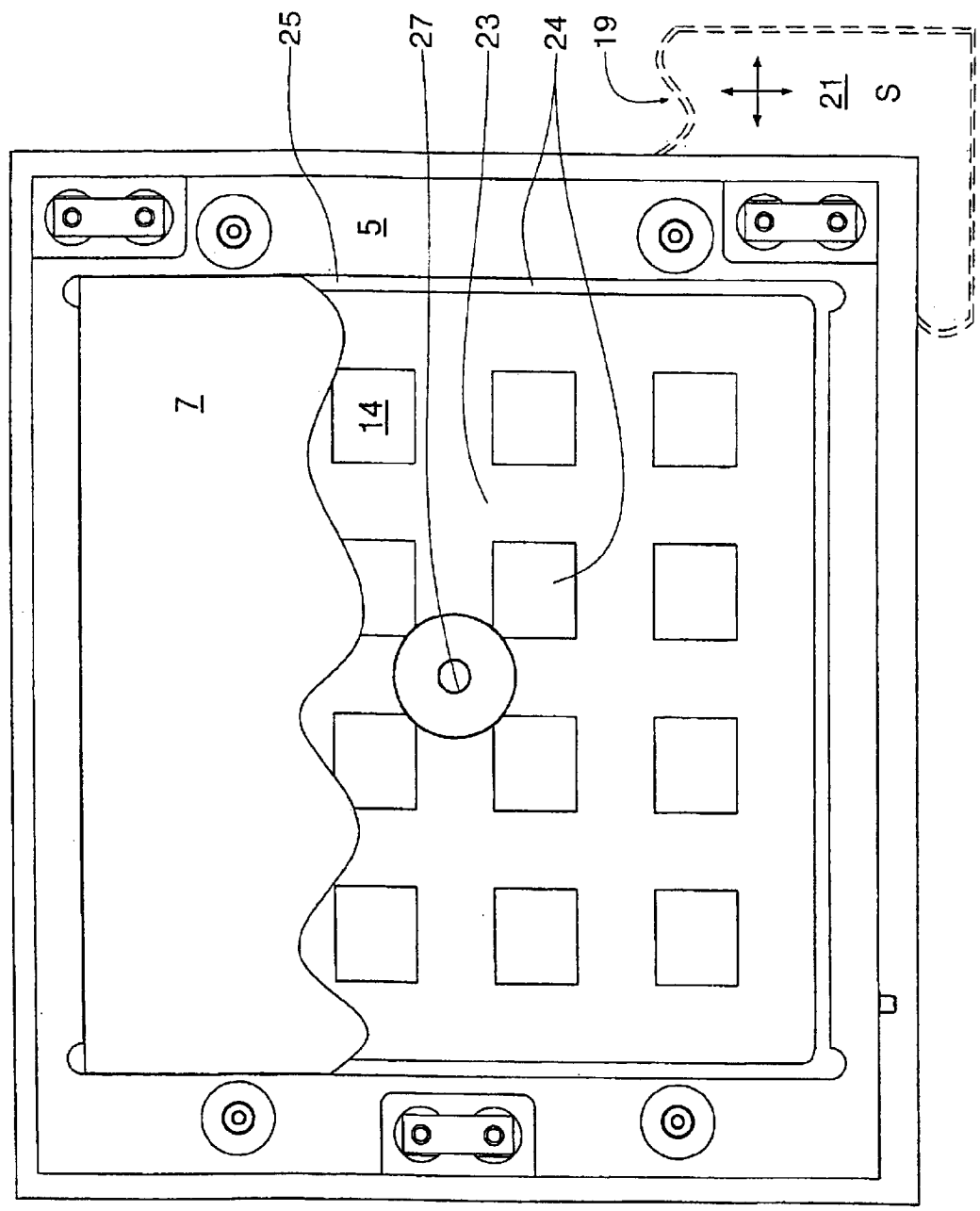
FIG. 2 is a simplified semidiagrammatic plan view of the preferred embodiment, partially cut away to show details of the support for the vacuum diffuser plate.
Figure 3:
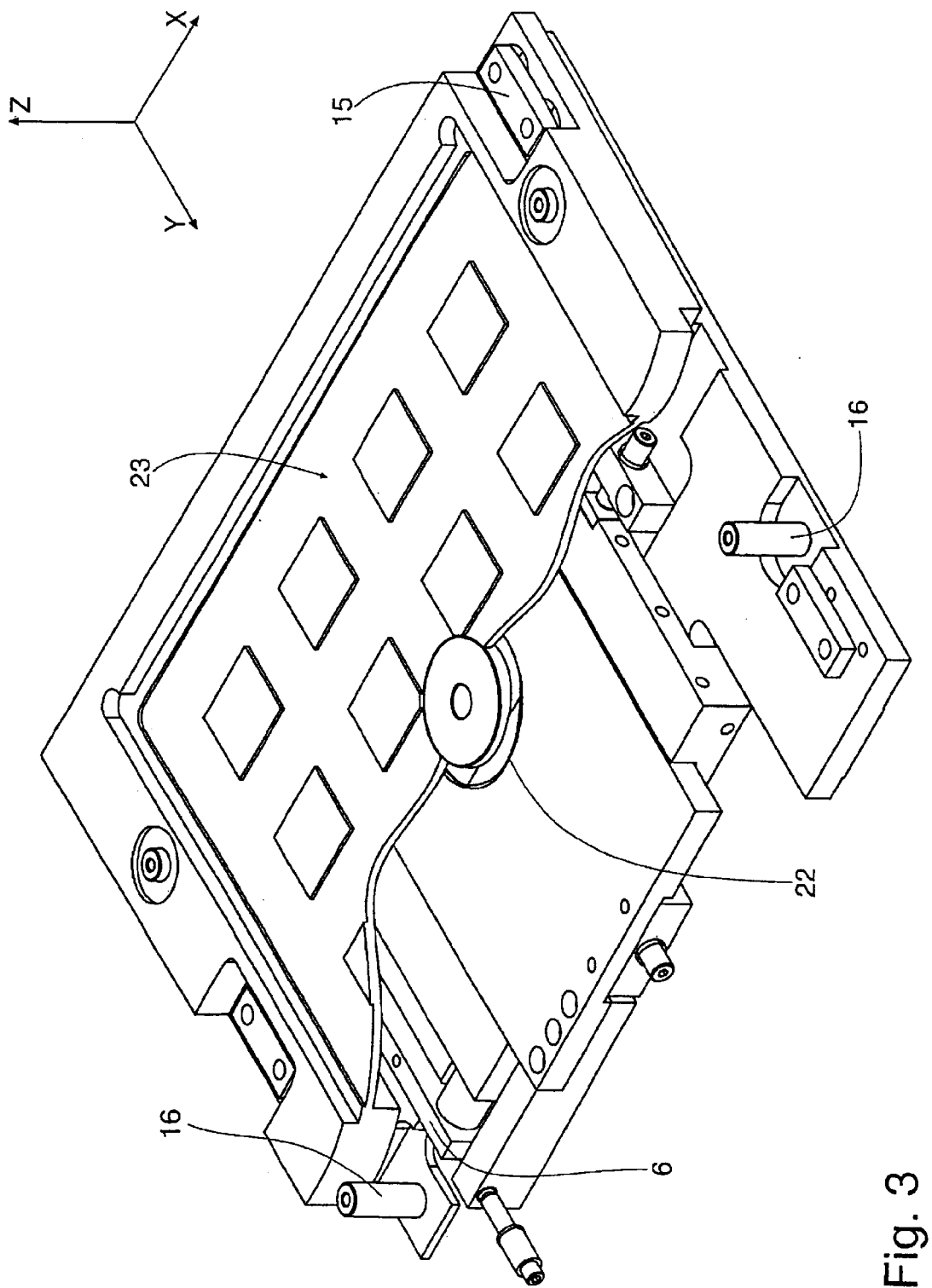
FIG. 3 is a semidiagrammatic isometric view of a preferred embodiment of the invention, similar to FIG. 1, partially cut away and with the diffuser plate removed to show x, y and theta adjustments and other details.
Figure 4:
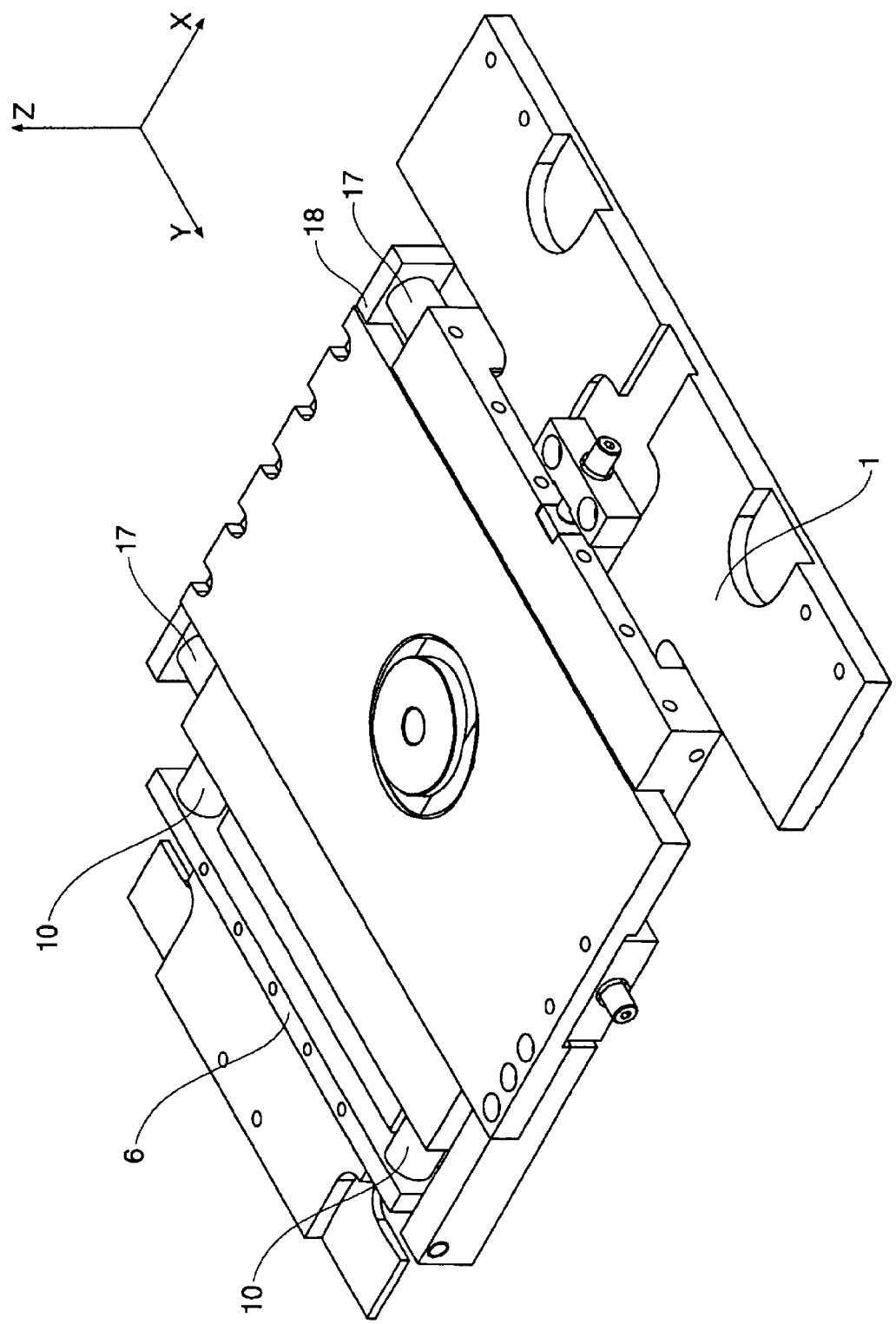
FIG. 4 is a semidiagrammatic isometric view of a preferred embodiment of the invention, similar to FIG. 1, with the diffuser plate and yaw vacuum diffuser bracket removed to show spring preload and other details.
Figure 5:
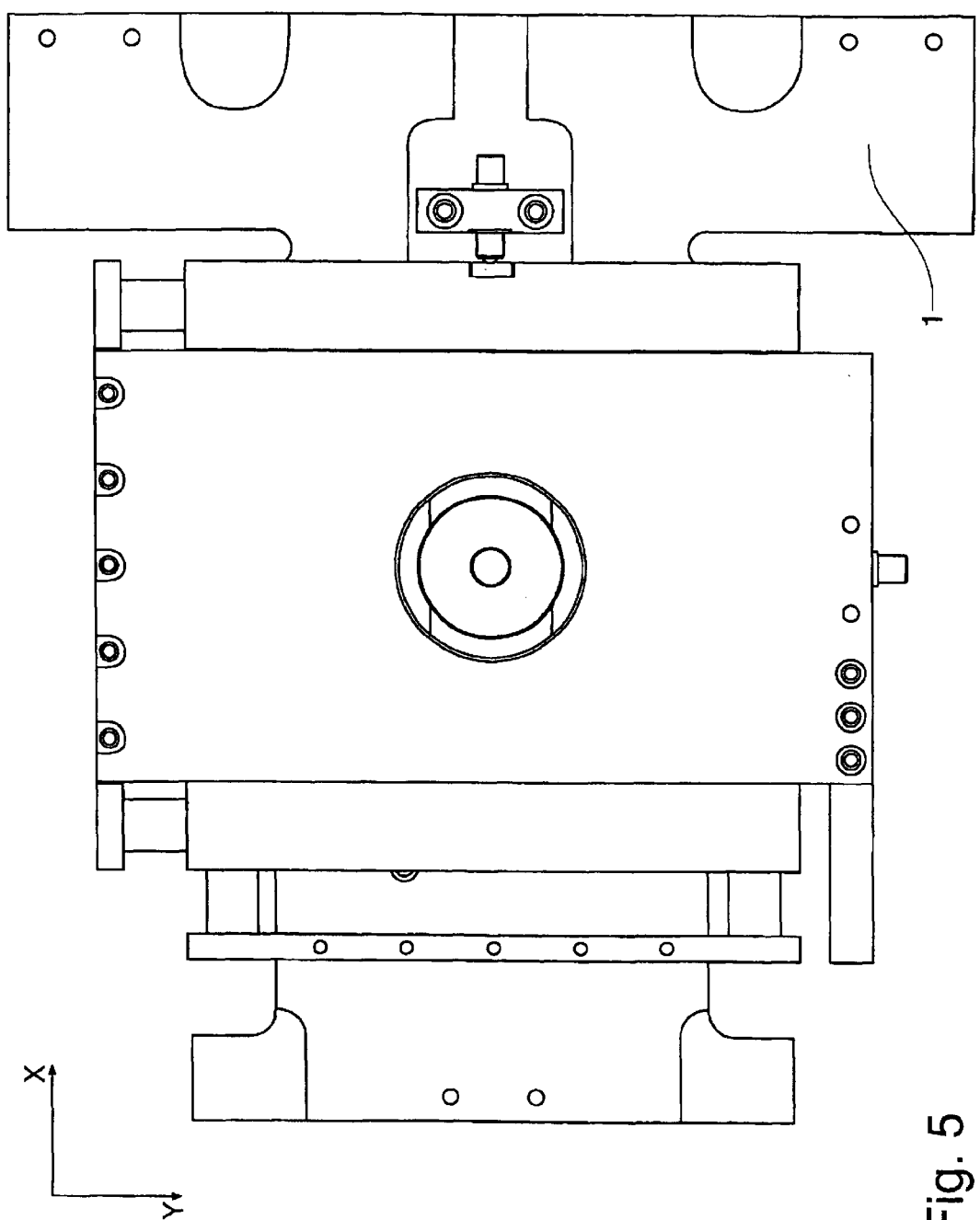
FIG. 5 is a plan view of the preferred embodiment, with parts removed, similar to FIG. 4.
Figure 6:
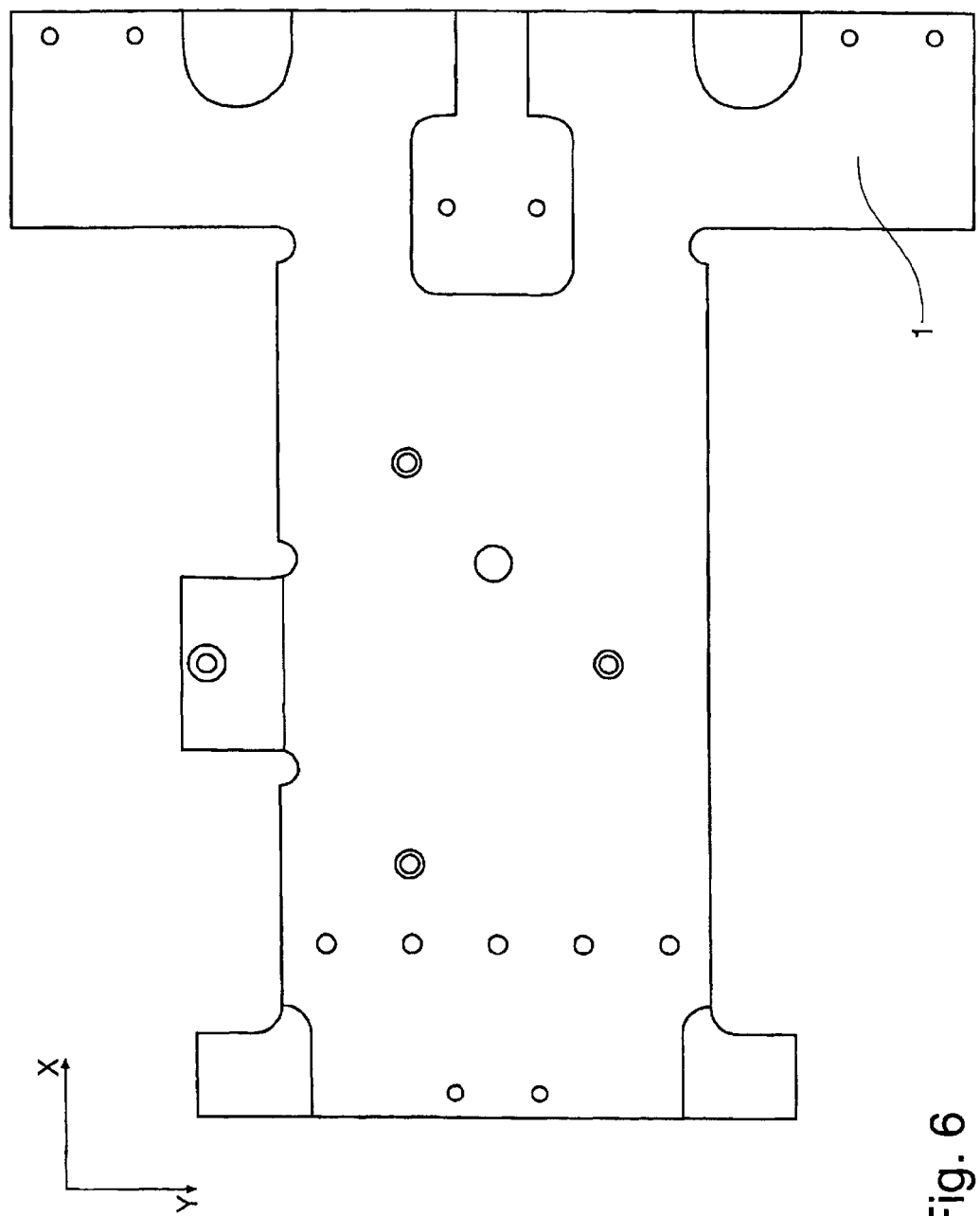
FIG. 6 is a plan view of the x bracket.

Significant parts are as follows:
1 x bracket
2 x, y bracket
3 y, theta bracket
4 yaw bracket
5 yaw vacuum diffuser bracket
6 x preload spring bracket
7 vacuum diffuser plate
8 yaw shaft
9 yaw preload spring assembly
10 x preload spring
11 x adjustment screw assembly
12 yaw adjustment screw
13 yaw adjustment screw assembly
14 vacuum diffuser plate support island
15 clamp
16 post
17 y preload spring
18 y preload spring bracket
19 high-resolution stage
20 central yaw shaft opening 21 high-resolution stage surface
22 yaw shaft opening
23 vacuum channel pattern
24 epoxy cement
25 peripheral vacuum diffuser plate locating relief
26 slideway
27 vacuum channel
28 x adjustment screw
29 y adjustment screw Operation The x bracket 1 may be considered the base for discussion of alignment motions. All other portions of the substrate chuck are movable with respect to the x bracket 1. Prior to start of the fine alignment procedure, the system has positioned a panel on the substrate chuck, where it is held in place by vacuum on vacuum diffuser plate 7. Vacuum is distributed to vacuum diffuser plate 7 through yaw vacuum diffuser bracket to vacuum diffuser plate support islands 14. FIGS. 1, 2 & 3 show the mounting of yaw vacuum diffuser bracket 5 rotatably about yaw shaft 8. Yaw adjustment screw 12 provides manual adjustment (theta) for yaw, moving the y, theta bracket 3 rotationally in the small increment required for theta adjustment of yaw vacuum diffuser bracket 5. Note that adjustments in theta, x and y are controlled respectively by theta, x and y adjustment screws, respectively numbered 12, 28 and 29, counteracted by preload springs. Two x preload springs 10 and two y preload springs 17 appear in FIG. 4. Assembly items such as clamp 15 and post 16 in FIGS. 1 and 3 hold parts in place generally, while allowing the small sliding motions of adjustment, and may be accessed from above through reliefs in overlying planes.

First, the operator moves the x, y bracket 2, using the x adjustment screw 28 in the x adjustment assembly 11. Next the operator moves the y, theta bracket 3, using the yaw adjustment screw 12 in the yaw bracket 4. Last, the operator moves the y, theta bracket 3 in slideway 26, using the y adjustment screw 29 in the y adjustment assembly 13. Adjustment screws work against related preload springs such as y preload spring 17 (FIG. 4), which is held by y preload spring bracket 18. It may be necessary to repeat one or more adjustments to reach final adjustment.

After completing the alignment process, the operator may cause the panel to be imaged or otherwise acted upon, and subsequently to access and align another panel.

The yaw shaft 8 is supported by x bracket 1, and permits other elements to rotate for yaw adjustment. Yaw preload spring assembly 9 holds vacuum diffuser plate 7 up—and holds y, theta bracket 3 down. The spring configuration is not critical, so long as it provides spacing and power sufficient to carry out its support function for vacuum diffuser plate 7.

Vacuum diffuser plate 7 is of rigid micropore material, carefully ground and polished for flatness. Yaw shaft 8 is preferably sealed and lubricated by a small amount of vacuum grease.

Manufacture The low-profile, alignable, x-y-theta substrate chuck, having a rigid, high-flatness, vacuum diffuser plate co-planar with the top plane of a substrate support yaw vacuum diffuser bracket, having a number of diffuser plate support islands, a peripheral diffuser plate support channel, and means to provide x, y and theta alignment adjustments while mounted on a flat surface of an area significantly greater than its own area, starting with x bracket 1, is made by the following method:

Step 1 dispensing a bead of epoxy cement 24 in the peripheral vacuum diffuser plate locating relief and dispensing beads of epoxy cement 24 on the vacuum diffuser plate support islands 14;

Step 2 placing a diffuser plate within said peripheral vacuum diffuser plate locating relief of said diffuser plate support with sufficient force to deform said beads of epoxy cement so as to make a pre-assembly with the surface of the diffuser plate and top plane non-co-planar;

Step 3 flipping the pre-assembly over onto a high-flatness rigid surface;

Step 4 shaking the pre-assembly, to co-planar juxtaposition of the vacuum diffuser plate 7 and top plane of the yaw vacuum diffuser bracket 5; and Step 5 letting the epoxy cement 24 cure.

Summary

The space between the movable platform of a precision stage and the bridge holding projection optics above the stage is limited by optical and mechanical requirements. The area of the stage platform is limited. A substrate chuck may increase the effective range of the stage platform, and may provide other advantages of positioning and aligning the substrate to the stage, particularly if the substrate is large and must be imaged panel-by-panel. Proper panel alignment requires high-resolution alignment motions in x, y and theta—but in a very limited vertical space.

The substrate chuck has semi-nesting slides for x and y alignments, and theta alignment rotation, all in very limited vertical space. All adjustment means are included within that very limited vertical space. Vacuum distribution and diffusion is also provided.

What is claimed is:

1. A low-profile vernier x-y-theta substrate chuck for mounting to the vacuum-equipped movable platform of a high-resolution stage for multi-exposure projection lithography on a substrate of greater area than the area of the substrate chuck, characterized by:

a) an x-bracket which serves as a mounting frame and has multiple supporting means and locating surfaces for other elements;

b) x-bracket adjustment means mounted on said x-bracket;

c) an x- y-bracket, having a slideway, mounted operatively to said x-bracket;

d) a y, theta bracket, mounted slidably in said slideway of said x-y bracket, said y, theta bracket having a central yaw shaft opening and vacuum channel;

e) a yaw shaft fitted within said yaw shaft opening;

f) y-bracket adjustment means;

g) a configured yaw vacuum diffuser bracket (5) having a top surface forming an apron, having a number of vacuum diffuser plate support islands (14) providing a support plane for a vacuum diffuser plate (7); and having a peripheral vacuum diffuser plate locating relief (25), with diffuser plate support islands (14) and peripheral vacuum diffuser plate locating relief (24) having a vertical position appropriate for supporting the bottom surface of a vacuum diffuser plate (7) with its top surface flush with the apron top surface of said yaw vacuum diffuser bracket (5) as a substrate support plane;

h) a vacuum diffuser plate (7), mounted to said yaw vacuum diffuser bracket (5); and i) adjustment means, for x, y and theta adjustment while mounted on the movable platform of such high resolution stage.

2. a low-profile vernier x-y-theta substrate chuck according to claim 1, wherein said vacuum diffuser plate (7) is cemented to said vacuum diffuser plate locating islands (14) and to said peripheral vacuum diffuser plate locating relief

(25) with the top surfaces of said vacuum diffuser plate (7) and the apron top surface of said yaw vacuum diffuser bracket (5) co-planar at said substrate support plane.

3. A low-profile vernier x-y-theta substrate chuck according to claim 1, wherein said adjustment means is operable while said substrate chuck is mounted on a high resolution stage.

4. A low-profile vernier x-y-theta substrate chuck according to claim 3, wherein said adjustment means includes x, y and theta adjustability operable while said substrate chuck is mounted on a high resolution stage.

5. A low-profile vernier x-y-theta substrate chuck according to claim 1, wherein said adjustment means includes separate x pre-load means and y pre-load means and x adjustment screws and y adjustment screws operable while said substrate chuck is mounted on a high resolution stage.

6. A low-profile vernier x-y-theta substrate chuck according to claim 5, wherein said adjustment means includes x, y, and theta adjustment screws operable while said substrate chuck is mounted on said high resolution stage.

7. A low-profile vernier x-y-theta substrate chuck according to claim 6, wherein said adjustment means includes x, y, and theta adjustment screws operable while said substrate chuck is mounted on said high resolution stage, and includes a yaw shaft (8) and a central support spring (9) for said yaw vacuum diffuser bracket 5, and also includes vacuum channel pattern means (24) juxtaposed with said yaw shaft (8).

8. A low-profile vernier x-y-theta substrate chuck having a rigid high-flatness vacuum diffuser plate (7) with its top surface co-planar with the top surface of a yaw vacuum diffuser bracket (5) in a substrate support plane, said yaw vacuum diffuser bracket (5) having a number of vacuum diffuser plate support islands (14), a peripheral vacuum diffuser plate locating relief (25), and means to provide x, y and theta alignment adjustment while mounted on a flat surface of area significantly greater than its area, made by the following method:

Step 1. Dispensing a bead of epoxy cement (24) in the peripheral vacuum diffuser plate locating relief (25) and dispensing beads of epoxy cement on tops of the islands (14);

Step 2. Placing a vacuum diffuser plate (7) within said peripheral vacuum diffuser plate locating relief (25) with sufficient force to deform said beads of epoxy cement so as to make a pre-assembly with the top surface of said vacuum diffuser plate (7) and top surface of said yaw vacuum diffuser bracket (5) plane non-coplanar;

Step 3. Flipping the pre-assembly over onto a high-flatness rigid surface;

Step 4. Shaking said pre-assembly to co-planar juxtaposition of the vacuum diffuser plate (7) and top surface of said yaw vacuum diffuser bracket (5); and Step 5. Letting the epoxy cement (24) cure.

9. An alignable, low-profile substrate chuck for patterning an indeterminate number of substrate panels, one at a time, adjustable in x, y and theta while on the movable platform of a stage, comprising:

an x-bracket (1);

an x, y—bracket (2) mounted movably to said x-bracket (1) and having a slideway (26);

a y, yaw bracket (3) mounted slidably in said slideway (26) of said x, y—bracket (2), having a central yaw shaft opening for a yaw shaft (8) and vacuum channel (27);

a yaw bracket (4) mounted in said slideway (26) and carrying a yaw shaft (8) with a vacuum channel (27);

a vacuum diffuser plate (7);

a yaw vacuum diffuser bracket (5) with a top surface forming an apron, configured with a peripheral vacuum diffuser plate locating relief (25) and a plurality of support islands (14) together providing positioning for said vacuum diffuser plate (7) with its top surface flush with such apron defining a substrate support plane; and x, y and theta adjustment means.

* * * * *